(12) United States Patent
Khlat (10) Patent No.: US 12,388,405 B2
(45) Date of Patent: Aug. 12, 2025

(54) POWER MANAGEMENT CIRCUIT SUPPORTING PHASE CORRECTION IN AN ANALOG SIGNAL WITH REDUCED PHYSICAL PINS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 529 days.

(21) Appl. No.: 17/842,875

(22) Filed: Jun. 17, 2022

(65) Prior Publication Data

US 2023/0111988 A1    Apr. 13, 2023

Related U.S. Application Data

(60) Provisional application No. 63/254,238, filed on Oct. 11, 2021.

(51) Int. Cl.
    *H03F 3/195* (2006.01)
(52) U.S. Cl.
    CPC ....... *H03F 3/195* (2013.01); *H03F 2200/102* (2013.01); *H03F 2200/451* (2013.01)
(58) Field of Classification Search
    CPC .... H03F 3/195; H03F 3/245; H03F 2200/102; H03F 2200/451; H03F 2201/3212; H03F 1/0227
    USPC ................................................. 330/136, 297
    See application file for complete search history.

(56) References Cited

U.S. PATENT DOCUMENTS

| | | | |
|---|---|---|---|
| 6,621,433 B1 | 9/2003 | Hertz | |
| 7,546,137 B2 | 6/2009 | D'Hont et al. | |
| 7,977,919 B1 | 7/2011 | Jaoude et al. | |
| 9,577,771 B1 | 2/2017 | Lashkarian et al. | |
| 9,755,579 B1 | 9/2017 | Ahmed et al. | |
| 11,165,515 B2 | 11/2021 | Tiebout et al. | |
| 11,533,068 B1 | 12/2022 | Sharma et al. | |
| 2007/0189417 A1 | 8/2007 | Waheed et al. | |
| 2012/0140852 A1 | 6/2012 | Kato et al. | |
| 2016/0164551 A1 | 6/2016 | Khlat et al. | |

(Continued)

OTHER PUBLICATIONS

U.S. Appl. No. 17/564,734, filed Dec. 29, 2021.

(Continued)

*Primary Examiner* — Andrea Lindgren Baltzell
*Assistant Examiner* — Nareh Shamiryan
(74) *Attorney, Agent, or Firm* — Withrow & Terranova, P.L.L.C.

(57) ABSTRACT

A power management circuit supporting phase correction in an analog signal with reduced physical pins is disclosed. The power management circuit includes a power amplifier circuit configured to amplify an analog signal having a time-variant power envelope based on a modulated voltage. The power management circuit also includes an envelope tracking integrated circuit (ETIC) configured to generate the modulated voltage and a modulated phase correction voltage to thereby cause a phase change in the analog signal. The ETIC receives a modulated differential signal that includes a common signal and a differential signal and generates the modulated phase correction voltage and the modulated voltage based on the common signal and the differential signal, respectively. By modulating the common signal and the differential signal into the modulated differential signal, it is possible to reduce physical pins in the ETIC to thereby reduce cost and footprint of the power management circuit.

21 Claims, 5 Drawing Sheets

(56) References Cited

U.S. PATENT DOCUMENTS

| | | |
|---|---|---|
| 2016/0249300 A1 | 8/2016 | Tsai et al. |
| 2022/0069774 A1 | 3/2022 | Emira et al. |
| 2022/0368283 A1 | 11/2022 | Folkmann et al. |
| 2022/0368293 A1 | 11/2022 | Khlat |
| 2022/0368294 A1 | 11/2022 | Khlat |
| 2022/0368295 A1 | 11/2022 | Khlat |
| 2022/0368300 A1 | 11/2022 | Khlat |
| 2023/0080652 A1 | 3/2023 | Khlat et al. |

OTHER PUBLICATIONS

U.S. Appl. No. 17/536,189, filed Nov. 29, 2021.
U.S. Appl. No. 17/564,852, filed Dec. 29, 2021.
U.S. Appl. No. 17/536,234, filed Nov. 29, 2021.
U.S. Appl. No. 17/552,791, filed Dec. 16, 2021.
Final Office Action for U.S. Appl. No. 17/564,734, mailed Sep. 25, 2024, 10 pages.
Non-Final Office Action for U.S. Appl. No. 17/536,189, mailed Oct. 1, 2024, 12 pages.
Non-Final Office Action for U.S. Appl. No. 17/564,852, mailed Oct. 1, 2024, 9 pages.
Non-Final Office Action for U.S. Appl. No. 17/536,234, mailed Oct. 16, 2024, 17 pages.
Notice of Allowance for U.S. Appl. No. 17/552,791, mailed Oct. 15, 2024, 7 pages.
Non-Final Office Action for U.S. Appl. No. 17/564,734, mailed Jul. 17, 2024, 9 pages.
Non-Final Office Action for U.S. Appl. No. 17/552,791, mailed Jun. 21, 2024, 6 pages.

POWER MANAGEMENT CIRCUIT SUPPORTING PHASE CORRECTION IN AN ANALOG SIGNAL WITH REDUCED PHYSICAL PINS

RELATED APPLICATIONS

This application claims the benefit of provisional patent application Ser. No. 63/254,238, filed Oct. 11, 2021, the disclosures of which are hereby incorporated herein by reference in their entireties.

FIELD OF THE DISCLOSURE

The technology of the disclosure relates generally to a power management circuit configured to enable phase correction in an analog signal, such as a radio frequency (RF) signal.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant ET voltage that closely tracks a time-variant power envelope of the RF signal(s). The time-variant voltage is typically generated by an ET integrated circuit (ETIC) in the wireless communication device. Notably, the inherent processing delay associated with the ETIC can inadvertently cause the time-variant ET voltage to misalign in time and/or phase with the time-variant power envelope of the RF signal(s). As a result, the peaks of the time-variant ET voltage may become misaligned with the peaks of the time-variant power envelope, which may cause the power amplifier(s) to clip and distort the RF signal(s). In this regard, it is desirable to ensure that the ETIC can maintain good time and phase alignment between the time-variant ET voltage and the time-variant power envelope of the RF signal(s).

SUMMARY

Aspects disclosed in the detailed description include a power management circuit supporting phase correction in an analog signal with reduced physical pins. The power management circuit includes a power amplifier circuit configured to amplify an analog signal having a time-variant power envelope based on a modulated voltage. The power management circuit also includes an envelope tracking integrated circuit (ETIC) configured to generate the modulated voltage and a modulated phase correction voltage to thereby cause a phase change in the analog signal. In embodiments disclosed herein, the ETIC receives a modulated differential signal that includes a common signal and a differential signal and generates the modulated phase correction voltage and the modulated voltage based on the common signal and the differential signal, respectively. By modulating the common signal and the differential signal into the modulated differential signal, it is possible to reduce physical pins in the ETIC to thereby reduce cost and footprint of the ETIC, and the power management circuit as a whole.

In one aspect, a power management circuit is provided. The power management circuit includes a power amplifier circuit. The power amplifier circuit is configured to amplify an analog signal based on a modulated voltage. The power management circuit also includes an ETIC. The ETIC includes a signal demodulation circuit. The signal demodulation circuit is configured to receive a modulated differential signal comprising a common signal modulated according to a first modulated signal and a differential signal modulated according to a second modulated signal. The signal demodulation circuit is also configured to demodulate the modulated differential signal to regenerate the first modulated signal and the second modulated signal. The ETIC also includes a phase correction circuit. The phase correction circuit is configured to generate a modulated phase correction voltage based on the first modulated signal to thereby cause a phase change in the analog signal. The ETIC also includes a voltage modulation circuit. The voltage modulation circuit is configured to generate the modulated voltage based on the second modulated signal.

In another aspect, a power management circuit is provided. The power management circuit includes a power amplifier circuit. The power amplifier circuit is configured to amplify an analog signal based on a modulated voltage. The power management circuit also includes an ETIC. The ETIC includes a signal demodulation circuit. The signal demodulation circuit is configured to receive a modulated differential signal comprising a common signal modulated according to a first modulated signal and a differential signal modulated according to a second modulated signal. The signal demodulation circuit is also configured to demodulate the modulated differential signal to regenerate the first modulated signal and the second modulated signal. The ETIC also includes a phase correction circuit. The phase correction circuit is configured to generate a modulated phase correction voltage based on the first modulated signal to thereby cause a phase change in the analog signal. The ETIC also includes a voltage modulation circuit. The voltage modulation circuit is configured to generate the modulated voltage based on the second modulated signal. The power management circuit also includes a transceiver circuit. The transceiver circuit is configured to generate the analog signal and the modulated differential signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to a power management circuit supporting phase correction in an analog signal with reduced physical pins. The power management circuit includes a power amplifier circuit configured to amplify an analog signal having a time-variant power envelope based on a modulated voltage. The power management circuit also includes an envelope tracking integrated circuit (ETIC) configured to generate the modulated voltage and a modulated phase correction voltage to thereby cause a phase change in the analog signal. In embodiments disclosed herein, the ETIC receives a modulated differential signal that includes a common signal and a differential signal and generates the modulated phase correction voltage and the modulated voltage based on the common signal and the differential signal, respectively. By modulating the common signal and the differential signal into the modulated differential signal, it is possible to reduce physical pins in the ETIC to thereby reduce cost and footprint of the ETIC, and the power management circuit as a whole.

Before discussing the power management circuit of the present disclosure, starting at FIG. 2, a brief overview of an existing power management circuit is first discussed with reference to FIG. 1 to help understand a need to reduce physical pins in the existing power management circuit.

Figure 1:
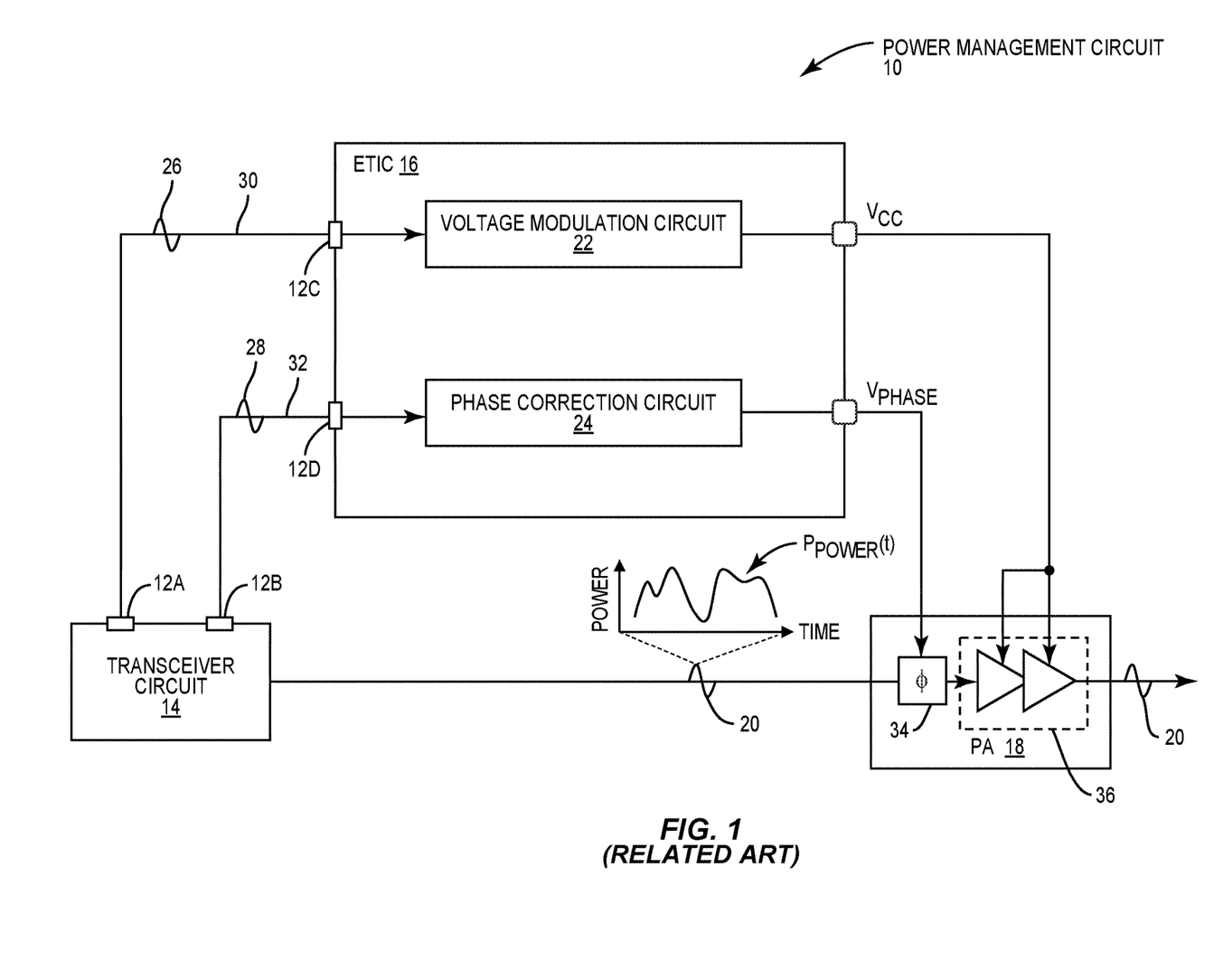
FIG. 1 is a schematic diagram of an exemplary existing power amplifier circuit, which requires multiple physical pins among a transceiver circuit and an envelope tracking integrated circuit (ETIC) for enabling analog signal phase correction.

FIG. 1 is a schematic diagram of an exemplary existing power management circuit 10, which requires multiple physical pins 12A, 12B, 12C, and 12D among a transceiver circuit 14 and an ETIC 16 for enabling analog signal phase correction. The existing power management circuit 10 includes a power amplifier circuit 18 that is coupled to the transceiver circuit 14 and the ETIC 16. The power amplifier circuit 18 is configured to amplify an analog signal 20 (e.g., a radio frequency signal) based on a modulated voltage $V_{CC}$, which can be an envelope tracking (ET) modulated voltage or an average power tracking (APT) modulated voltage.

The ETIC 16 is configured to generate the modulated voltage $V_{CC}$, which tracks a time-variant power envelope $P_{POWER}(t)$ of the analog signal 20, and a modulated phase correction voltage $V_{PHASE}$ to thereby cause a phase change in the analog signal 20. Specifically, a correlation between the time-variant power envelope $P_{POWER}(t)$, the modulated voltage $V_{CC}$, and the modulated phase correction voltage $V_{PHASE}$ can be explored to thereby allow the ETIC 16 to generate the modulated voltage $V_{CC}$ and the modulated phase correction voltage $V_{PHASE}$ based on the time-variant power envelope $P_{POWER}(t)$ of the analog signal 20.

Specifically, the ETIC 16 includes a voltage modulation circuit 22 and a phase correction circuit 24. The voltage modulation circuit 22 is configured to generate the modulated voltage $V_{CC}$ based on a first modulated signal 26, and the phase correction circuit 24 is configured to generate the modulated phase correction voltage $V_{PHASE}$ based on a second modulated signal 28. In an embodiment, the first modulated signal 26 is provided from the transceiver circuit 14 to the voltage modulation circuit 22 via a first conductive path 30 that is coupled between the physical pin 12A in the transceiver circuit 14 and the physical pin 12C in the ETIC 16. The second modulated signal 28 is provided from the transceiver circuit 14 to the phase correction circuit 24 via a second conductive path 32 that is coupled between the physical pin 12B in the transceiver circuit 14 and the physical pin 12D in the ETIC 16.

The transceiver circuit 14 can be further configured to generate and provide the analog signal 20 to the power amplifier circuit 18. In addition, the transceiver circuit 14 is also configured to generate the first modulated signal 26 and the second modulated signal 28 in accordance with the time-variant power envelope $P_{POWER}(t)$ of the analog signal 20.

The power amplifier circuit 18 can be configured to include a phase shifter circuit 34 and a power amplifier 36. The phase shifter circuit 34 is coupled to the phase correction circuit 24 to receive the modulated phase correction voltage $V_{PHASE}$. The phase shifter circuit 34 may include internal storage (not shown), such as registers for example, to store a correlation between various levels of the modulated phase correction voltage $V_{PHASE}$ and various degrees of phase shift. For example, storing a correlation between the modulated phase correction voltage $V_{PHASE}$ of 0 V, 1 V, and 2 V and a phase shift of 0°, 1°, and 2°, respectively. Accordingly, the phase shifter circuit 34 can determine a phase shift based on the modulated phase correction voltage $V_{PHASE}$ and phase-shift the analog signal 20 based on the determined phase shift.

The power amplifier 36 can be any type of power amplifier, including but not limited to a Doherty power amplifier, differential power amplifier, multi-stage power amplifier, single-stage power amplifier, etc. The power amplifier 36 is coupled to the phase shifter circuit 34 to amplify the analog signal 20, which may have been phase-shifted and/or amplitude-adjusted by the phase shifter circuit 34. For a more detailed description on various embodiments of the existing power management circuit 10, please refer to U.S. patent application Ser. No. 17/536,189, entitled "POWER MANAGEMENT CIRCUIT SUPPORTING PHASE CORRECTION IN AN ANALOG SIGNAL" (hereinafter "App189").

Notably, the existing power management circuit 10 relies on the physical pins 12A, 12B, 12C, and 12D to communicate the first modulated signal 26 and the second modulated signal 28 from the transceiver circuit 14 to the ETIC 16. Understandably, employing the physical pins 12A, 12B, 12C, and 12D not only add to the cost of the existing power management circuit 10, but can also lead to increased footprint and/or design complexity. As real estate becomes increasingly expensive in state-of-the-art wireless communication devices (e.g., smartphone, smart gadget, etc.), it is thus desirable to carry out the functionalities of the existing power management circuit 10 with a reduced number of the physical pins 12A, 12B, 12C, and 12D.

Figure 2:
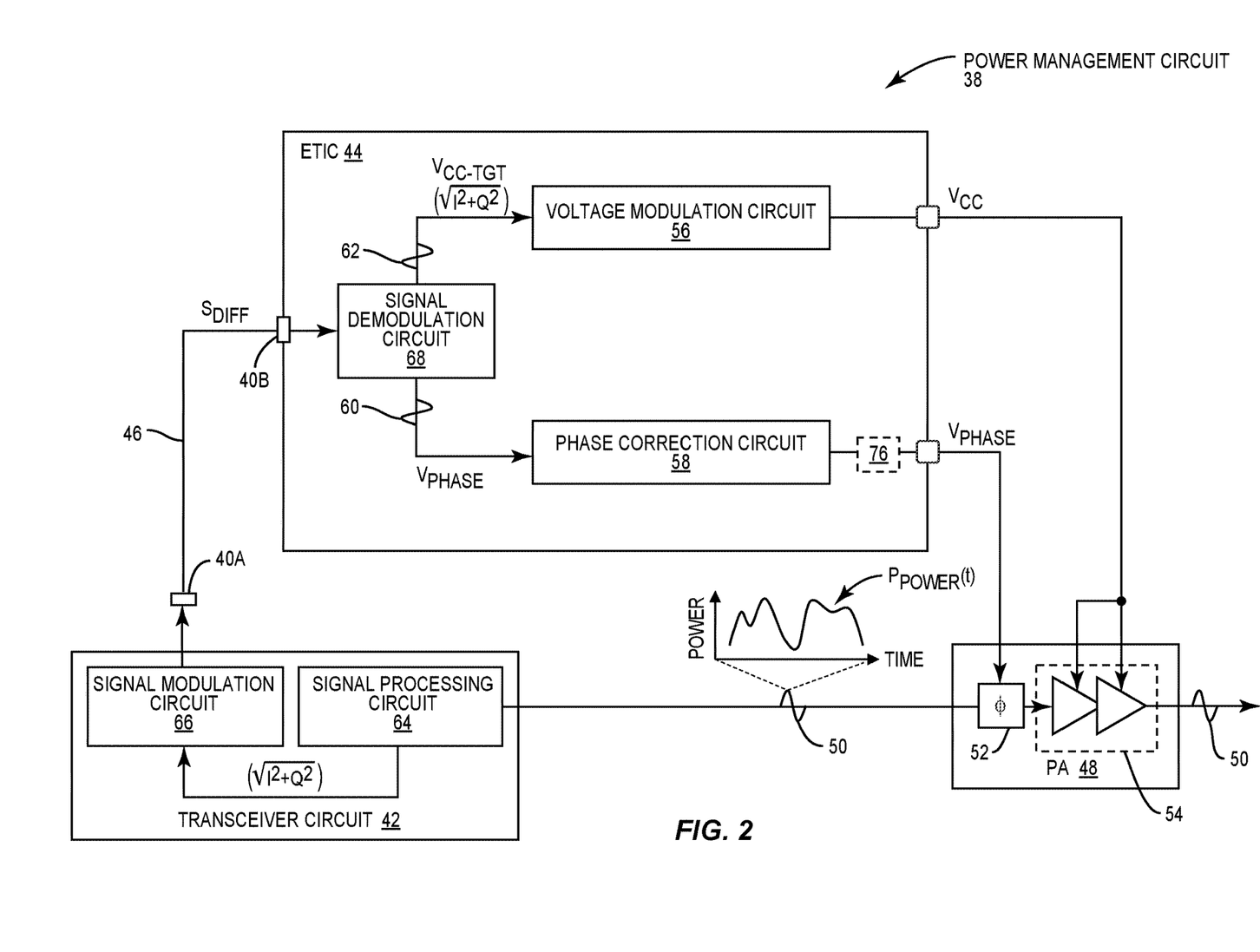
FIG. 2 is a schematic diagram of an exemplary power management circuit configured according to one embodiment of the present disclosure to enable analog signal phase correction with a reduced number of physical pins than the existing power management circuit of FIG. 1.

In this regard, FIG. 2 is a schematic diagram of an exemplary power management circuit 38 configured according to one embodiment of the present disclosure to enable analog signal phase correction with a reduced number of physical pins 40A, 40B than the existing power management circuit 10 of FIG. 1. Herein, the power management circuit 38 includes a transceiver circuit 42 that exposes the physical pin 40A and an ETIC 44 that exposes the physical pin 40B. The physical pin 40A may be coupled to the physical pin 40B via a conductive path 46. As described in detail below, the power management circuit 38 can carry out the same functionality as the existing power management circuit 10 of FIG. 1 with half of the physical pins as required by the existing power management circuit 10. As such, it is possible to reduce cost, footprint, and/or complexity of the power management circuit 38.

The power management circuit 38 also includes a power amplifier circuit 48 configured to amplify an analog signal 50 (e.g., a radio frequency signal). In a non-limiting example, the power amplifier circuit 48 is identical to the power amplifier circuit 18 in the existing power management circuit 10. As such, the power amplifier circuit 48 can also include a phase shifter circuit 52, which may be identical to the phase shifter circuit 34, and a power amplifier 54, which may be identical to the power amplifier 36. Like the phase shifter circuit 34, the phase shifter circuit 52 is configured to phase shift the analog signal 50 based on a modulated phase correction voltage $V_{PHASE}$ and the power amplifier 54 is configured to amplify the phase corrected analog signal 50 based on a modulated voltage $V_{CC}$.

Like the existing power management circuit 10, the ETIC 44 includes a voltage modulation circuit 56 and a phase correction circuit 58. The phase correction circuit 58 is coupled to the phase shifter circuit 52 and configured to generate the modulated phase correction voltage $V_{PHASE}$ based on a first modulated signal 60. The voltage modulation circuit 56 is coupled to the power amplifier 54 and configured to generate the modulated voltage $V_{CC}$ based on a second modulated signal 62. For various embodiments of the voltage modulation circuit 56 and the phase correction circuit 58, please refer to App189.

According to an embodiment of the present disclosure, the transceiver circuit 42 includes a signal processing circuit 64 and a signal modulation circuit 66. The signal processing circuit 64 is configured to generate the analog signal 50 associated with a time-variant power envelope $P_{POWER}(t)$ and provide the analog signal 50 to the power amplifier circuit 48. In an embodiment, the signal processing circuit 64 may first generate a digital version of the analog signal 50 with an in-phase (I) component and a quadrature (Q) component and then perform a digital-to-analog conversion to generate the analog signal 50. As such, the signal processing circuit 64 can capture a time-variant amplitude $\sqrt{I^2+Q^2}$ of the analog signal 50 and provide the time-variant amplitude $\sqrt{I^2+Q^2}$ to the signal modulation circuit 66.

The signal modulation circuit 66 is coupled to the physical pin 40A and configured to generate a modulated differential signal $S_{DIFF}$ that includes the first modulated signal 60 and the second modulated signal 62. The ETIC 44, on the other hand, includes a signal demodulation circuit 68. The signal demodulation circuit 68 is coupled to the physical pin 40B to receive the modulated differential signal $S_{DIFF}$. Accordingly, the signal demodulation circuit 68 is configured to demodulate the modulated differential signal $S_{DIFF}$ to regenerate the first modulated signal 60 and the second modulated signal 62.

In one embodiment, the first modulated signal 60 can be the modulated phase correction $V_{PHASE}$ and the second modulated signal 62 can be a modulated target voltage $V_{CC-TGT}$ that is identical or substantially similar to the time-variant amplitude $\sqrt{I^2+Q^2}$. In this regard, the modulated differential signal $S_{DIFF}$ will include the modulated phase correction $V_{PHASE}$ and the modulated target voltage $V_{TGT}$, and the signal demodulation circuit 68 will regenerate the modulated phase correction $V_{PHASE}$ and the modulated target voltage $V_{CC-TGT}$ from the modulated differential signal $S_{DIFF}$. Accordingly, the phase correction circuit 58 can pass the modulated phase correction $V_{PHASE}$ directly to the phase shifter circuit 52, and the voltage modulation circuit 56 will, in turn, generate the modulated voltage $V_{CC}$ based on the modulated target voltage $V_{CC-TGT}$.

Figure 3:
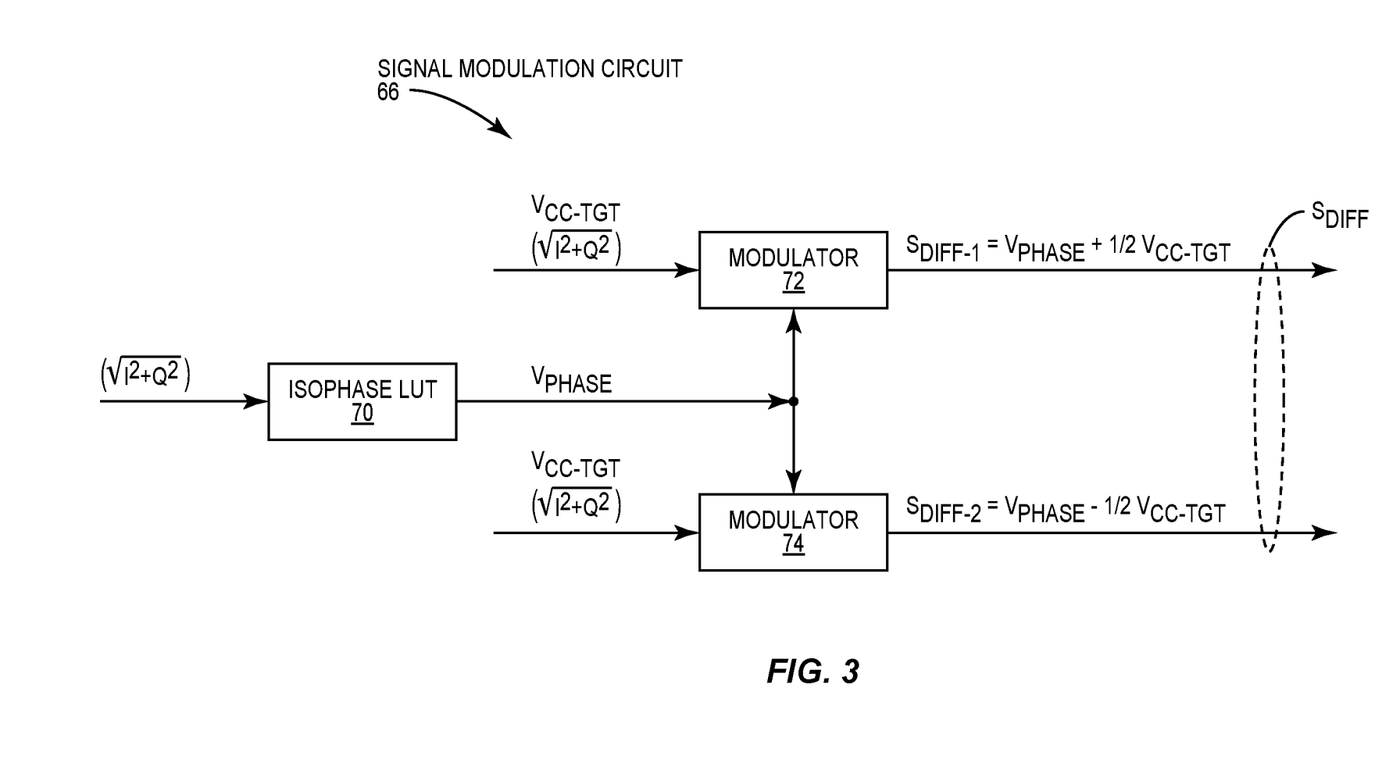
FIG. 3 is a schematic diagram of an exemplary signal modulation circuit in the power management circuit of FIG. 2.

FIG. 3 is a schematic diagram providing an exemplary illustration of the signal modulation circuit 66 in the transceiver circuit 42 in FIG. 2. Common elements between FIGS. 2 and 3 are shown therein with common element numbers and will not be re-described herein.

Herein, the signal modulation circuit 66 can be configured to include an isophase lookup table (LUT) circuit 70, a first modulator 72, and a second modulator 74. The isophase LUT circuit 70 may be configured to generate the modulated phase correction voltage $V_{PHASE}$ based on the time-variant amplitude $\sqrt{I^2+Q^2}$ of the analog signal 50.

The first modulator 72 is configured to generate a first differential signal $S_{DIFF-1}$ of the modulated differential signal $S_{DIFF}$ and the second modulator 74 is configured to generate a second differential signal $S_{DIFF-2}$ of the modulated differential signal $S_{DIFF}$. Specifically, the first modulator 72 can generate the first differential signal $S_{DIFF-1}$ by adding one-half (½) of the modulated target voltage $V_{CC-TGT}$ to the modulated phase correction voltage $V_{PHASE}$ ($S_{DIFF-1}=V_{PHASE}+½V_{CC-TGT}$). In contrast, the second modulator 74 can generate the second differential signal $S_{DIFF-1}$ by subtracting one-half (½) of the modulated target voltage $V_{CC-TGT}$ from the modulated phase correction voltage $V_{PHASE}$ ($S_{DIFF-2}=V_{PHASE}-½V_{CC-TGT}$). In other words, the modulated differential signal $S_{DIFF}$ will be made of a common signal (a.k.a. the modulated phase correction voltage $V_{PHASE}$) and a differential signal (a.k.a. the modulated target voltage $V_{CC-TGT}$).

Conventionally, a differential signal is commonly generated by using a direct-current (DC) voltage (a.k.a. a constant voltage) as the common signal. In this regard, the signal modulation circuit 66 is different from a conventional circuit in that the common signal is instead a modulated signal that varies over time.

With reference back to FIG. 2, in an embodiment, the signal demodulation circuit 68 is configured to regenerate the modulated phase correction voltage $V_{PHASE}$ by summing up the first differential signal $S_{DIFF-1}$ and the second differential signal $S_{DIFF-1}$ and then divide the sum by two ($V_{PHASE}=(S_{DIFF-1}+S_{DIFF-2})/2$). The signal demodulation circuit 68 is further configured to regenerate the modulated target voltage $V_{CC-TGT}$ by subtracting the second differential signal $S_{DIFF-1}$ from the first differential signal $S_{DIFF-1}$ ($V_{CC-TGT}=V_{DIFF-1}-V_{DIFF-2}$). Notably, subtracting the second differential signal $S_{DIFF-1}$ from the first differential signal $S_{DIFF-1}$ can cause the modulated phase correction voltage $V_{PHASE}$ (a.k.a. the common signal) to be cancelled out. As such, the modulated target voltage $V_{CC-TGT}$ may be immune to possible dripple of the modulated phase correction voltage $V_{PHASE}$.

In an embodiment, the ETIC 44 may also include an auxiliary circuit 76. The auxiliary circuit 76 may source or sink additional current and/or voltage based on, for example, impedance variation of the power amplifier circuit 48.

In another embodiment, the first modulated signal 60 can be a modulated phase correction target voltage $V_{PHASE-TGT}$ and the second modulated signal 62 can be a modulated target voltage $V_{CC-TGT}$, both of which are identical or substantially similar to the time-variant amplitude $\sqrt{I^2+Q^2}$. In this regard, the modulated differential signal $S_{DIFF}$ will include the phase correction target voltage $V_{PHASE-TGT}$ and the modulated target voltage $V_{TGT}$, and the signal demodulation circuit 68 will regenerate the phase correction target voltage $V_{PHASE-TGT}$ and the modulated target voltage $V_{CC-TGT}$ from the modulated differential signal $S_{DIFF}$.

Figure 4:
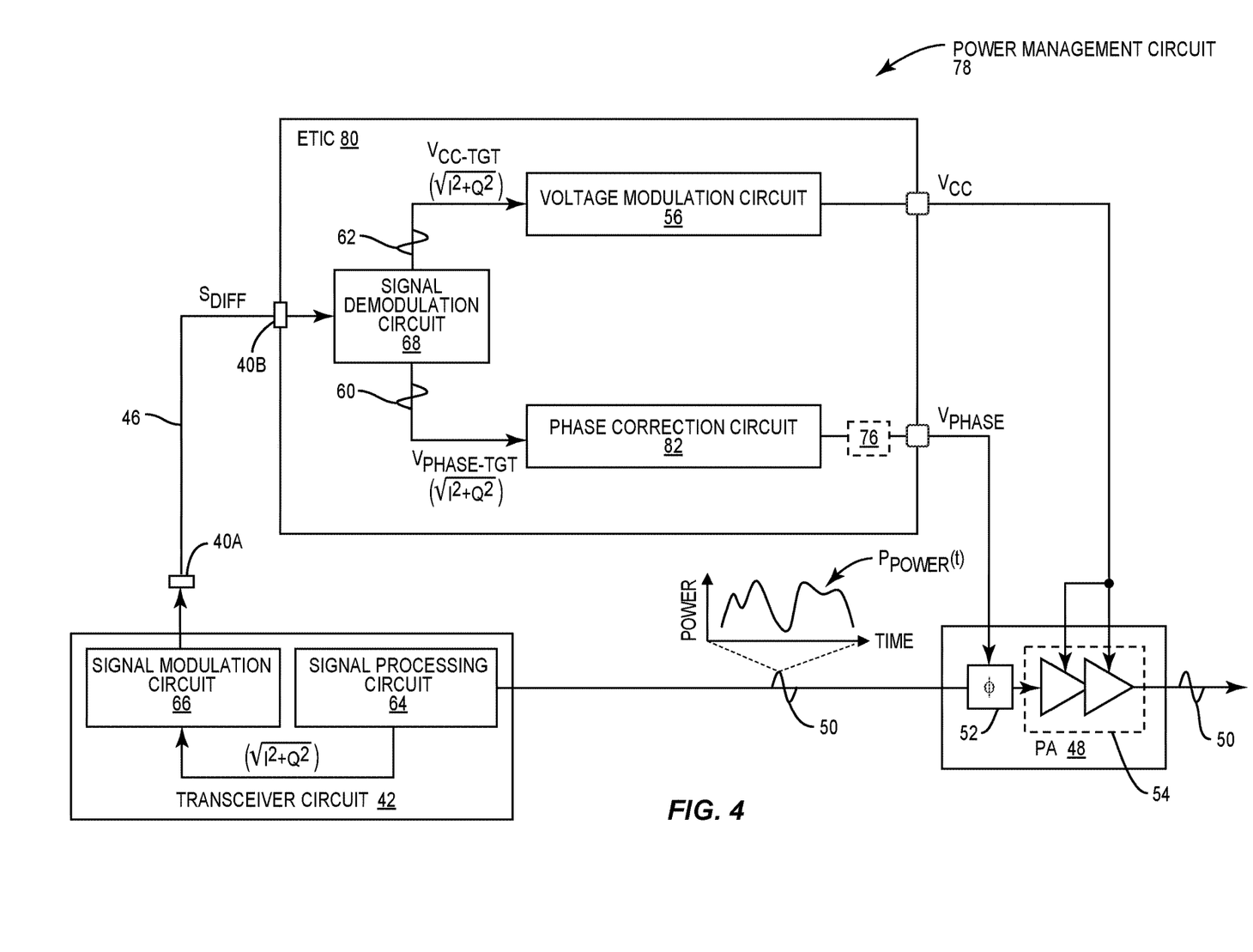
FIG. 4 is a schematic diagram of an exemplary power management circuit configured according to another embodiment of the present disclosure to enable analog signal phase correction with a reduced number of physical pins than the existing power management circuit of FIG. 1.

FIG. 4 is a schematic diagram of an exemplary power management circuit 78 configured according to another embodiment of the present disclosure. Common elements between FIGS. 2 and 4 are shown therein with common element numbers and will not be re-described herein.

The power management circuit 78 can include an ETIC 80, which further includes a phase correction circuit 82. In an embodiment, the phase correction circuit 82 can be configured to incorporate the isophase LUT circuit 70 in FIG. 3. Accordingly, the phase correction circuit 82 can generate the modulated phase correction $V_{PHASE}$ based on the modulated phase correction target voltage $V_{PHASE-TGT}$ and provide the modulated phase correction $V_{PHASE}$ to the phase shifter circuit 52.

Figure 5:
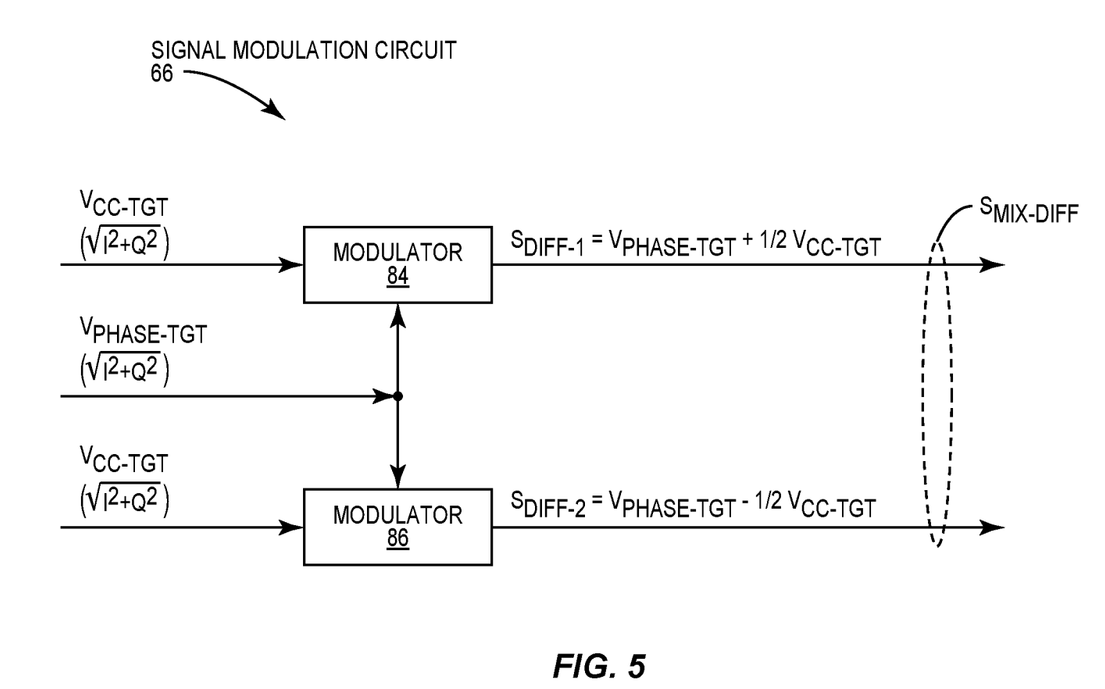
FIG. 5 is a schematic diagram of an exemplary signal modulation circuit in the power management circuit of FIG. 3.

FIG. 5 is a schematic diagram providing an exemplary illustration of the signal modulation circuit 66 in the transceiver circuit 42 in FIG. 4. Common elements between FIGS. 4 and 5 are shown therein with common element numbers and will not be re-described herein.

Herein, the signal modulation circuit 66 can be configured to include a first modulator 84 and a second modulator 86. The first modulator 84 is configured to generate a first differential signal $S_{DIFF-1}$ of the modulated differential signal $S_{DIFF}$ and the second modulator 86 is configured to generate a second differential signal $S_{DIFF-1}$ of the modulated differential signal $S_{DIFF}$. Specifically, the first modulator 84 can generate the first differential signal $S_{DIFF-1}$ by adding one-half (½) of the modulated target voltage $V_{CC-TGT}$ to the modulated phase correction target voltage $V_{PHASE-TGT}$ ($S_{DIFF-1}=V_{PHASE-TGT}+½V_{CC-TGT}$). In contrast, the second modulator 86 can generate the second differential signal $S_{DIFF-1}$ by subtracting one-half (½) of the modulated target voltage $V_{CC-TGT}$ from the modulated phase correction target voltage $V_{PHASE-TGT}$ ($S_{DIFF-2}=V_{PHASE-TGT}-½V_{CC-TGT}$). In other words, the modulated differential signal $S_{DIFF}$ will be made of a common signal (a.k.a. the modulated phase correction target voltage $V_{PHASE-TGT}$) and a differential signal (a.k.a. the modulated target voltage $V_{CC-TGT}$).

With reference back to FIG. 4, in an embodiment, the signal demodulation circuit 68 is configured to regenerate the modulated phase correction target voltage $V_{PHASE-TGT}$ by summing up the first differential signal $S_{DIFF-1}$ and the second differential signal $S_{DIFF-1}$ and then divide the sum by two ($V_{PHASE-TGT}=(S_{DIFF-1}+S_{DIFF-2})/2$). The signal demodulation circuit 68 is further configured to regenerate the modulated target voltage $V_{CC-TGT}$ by subtracting the second differential signal $S_{DIFF-1}$ from the first differential signal $S_{DIFF-1}$ ($V_{CC-TGT}=V_{DIFF-1}-V_{DIFF-2}$). Notably, subtracting the second differential signal $S_{DIFF-1}$ from the first differential signal $S_{DIFF-1}$ can cause the modulated phase correction voltage $V_{PHASE}$ (a.k.a. the common signal) to be cancelled out. As such, the modulated target voltage $V_{CC-TGT}$ may be immune to possible dripple of the modulated phase correction target voltage $V_{PHASE-TGT}$.

Those skilled in the art will recognize improvements and modifications to the preferred embodiments of the present disclosure. All such improvements and modifications are considered within the scope of the concepts disclosed herein and the claims that follow.

What is claimed is:

1. A power management circuit comprising:
a power amplifier circuit configured to amplify an analog signal based on a modulated voltage; and
an envelope tracking integrated circuit (ETIC) comprising:
 a signal demodulation circuit configured to:
  receive a modulated differential signal comprising a common signal modulated according to a first modulated signal and a differential signal modulated according to a second modulated signal; and
  demodulate the modulated differential signal to regenerate the first modulated signal and the second modulated signal;
 a phase correction circuit configured to generate a modulated phase correction voltage based on the first modulated signal to thereby cause a phase change in the analog signal; and
 a voltage modulation circuit configured to generate the modulated voltage based on the second modulated signal.

2. The power management circuit of claim 1, further comprising a transceiver circuit coupled to the ETIC and the power amplifier circuit, the transceiver circuit comprising:
a signal modulation circuit configured to modulate and provide the modulated differential signal to the signal demodulation circuit; and
a signal processing circuit configured to:
 generate the analog signal having a time-variant amplitude and provide the analog signal to the power amplifier circuit; and
 provide the time-variant amplitude of the analog signal to the signal modulation circuit.

3. The power management circuit of claim 2, wherein the signal modulation circuit is further configured to modulate the modulated differential signal to comprise:
the modulated phase correction voltage as the common signal; and
a modulated target voltage as the differential signal.

4. The power management circuit of claim 3, wherein:
the voltage modulation circuit is further configured to generate the modulated voltage based on the modulated target voltage; and
the phase correction circuit is further configured to provide the modulated phase correction voltage directly to the phase shifter circuit.

5. The power management circuit of claim 3, wherein the signal modulation circuit comprises:
an isophase lookup table (LUT) circuit configured to generate the modulated phase correction voltage based on the time-variant amplitude of the analog signal;
a first modulator configured to generate a first differential signal of the modulated differential signal, the first differential signal being equal to a sum of the modulated phase correction voltage and one-half of the time-variant amplitude; and
a second modulator configured to generate a second differential signal of the modulated differential signal, the second differential signal being equal to the modulated phase correction voltage subtracted by one-half of the time-variant amplitude.

6. The power management circuit of claim 5, wherein the signal demodulation circuit is further configured to:
regenerate the modulated phase correction voltage to equal one-half of a sum of the first differential signal and the second differential signal; and
regenerate the modulated target voltage by subtracting the second differential signal from the first differential signal.

7. The power management circuit of claim 2, wherein the signal modulation circuit is further configured to modulate the modulated differential signal to comprise:
a modulated phase correction target voltage as the common signal; and
a modulated target voltage as the differential signal.

8. The power management circuit of claim 7, wherein:
the voltage modulation circuit is further configured to generate the modulated voltage based on the modulated target voltage; and
the phase correction circuit is further configured to generate the modulated phase correction voltage based on the modulated phase correction target voltage.

9. The power management circuit of claim 7, wherein the signal modulation circuit comprises:
a first modulator configured to generate a first differential signal of the modulated differential signal, the first differential signal being equal to a sum of the time-variant amplitude and one-half of the time-variant amplitude; and
a second modulator configured to generate a second differential signal of the modulated differential signal, the second differential signal being equal to the time-variant amplitude subtracted by one-half of the time-variant amplitude.

10. The power management circuit of claim 9, wherein the signal demodulation circuit is further configured to:
regenerate the modulated phase correction voltage to equal one-half of a sum of the first differential signal and the second differential signal; and
regenerate the modulated target voltage by subtracting the second differential signal from the first differential signal.

11. A power management circuit comprising:
a power amplifier circuit configured to amplify an analog signal based on a modulated voltage;
an envelope tracking integrated circuit (ETIC) comprising:
 a signal demodulation circuit configured to:
  receive a modulated differential signal comprising a common signal modulated according to a first modulated signal and a differential signal modulated according to a second modulated signal; and
  demodulate the modulated differential signal to regenerate the first modulated signal and the second modulated signal;

a phase correction circuit configured to generate a modulated phase correction voltage based on the first modulated signal to thereby cause a phase change in the analog signal; and a voltage modulation circuit configured to generate the modulated voltage based on the second modulated signal; and a transceiver circuit configured to generate the analog signal and the modulated differential signal.

12. The power management circuit of claim 11, wherein the transceiver circuit comprises:

a signal modulation circuit configured to modulate and provide the modulated differential signal to the signal demodulation circuit; and a signal processing circuit configured to:

generate the analog signal having a time-variant amplitude and provide the analog signal to the power amplifier circuit; and provide the time-variant amplitude of the analog signal to the signal modulation circuit.

13. The power management circuit of claim 12, wherein the signal modulation circuit is further configured to modulate the modulated differential signal to comprise:

the modulated phase correction voltage as the common signal; and a modulated target voltage as the differential signal.

14. The power management circuit of claim 13, wherein:

the voltage modulation circuit is further configured to generate the modulated voltage based on the modulated target voltage; and the phase correction circuit is further configured to provide the modulated phase correction voltage directly to the phase shifter circuit.

15. The power management circuit of claim 13, wherein the signal modulation circuit comprises:

an isophase lookup table (LUT) circuit configured to generate the modulated phase correction voltage based on the time-variant amplitude of the analog signal;

a first modulator configured to generate a first differential signal of the modulated differential signal, the first differential signal being equal to a sum of the modulated phase correction voltage and one-half of the time-variant amplitude; and a second modulator configured to generate a second differential signal of the modulated differential signal, the second differential signal being equal to the modulated phase correction voltage subtracted by one-half of the time-variant amplitude.

16. The power management circuit of claim 15, wherein the signal demodulation circuit is further configured to:

regenerate the modulated phase correction voltage to equal one-half of a sum of the first differential signal and the second differential signal; and regenerate the modulated target voltage by subtracting the second differential signal from the first differential signal.

17. The power management circuit of claim 12, wherein the signal modulation circuit is further configured to modulate the modulated differential signal to comprise:

a modulated phase correction target voltage as the common signal; and a modulated target voltage as the differential signal.

18. The power management circuit of claim 17, wherein:

the voltage modulation circuit is further configured to generate the modulated voltage based on the modulated target voltage; and the phase correction circuit is further configured to generate the modulated phase correction voltage based on the modulated phase correction target voltage.

19. The power management circuit of claim 17, wherein the signal modulation circuit comprises:

a first modulator configured to generate a first differential signal of the modulated differential signal, the first differential signal being equal to a sum of the time-variant amplitude and one-half of the time-variant amplitude; and a second modulator configured to generate a second differential signal of the modulated differential signal, the second differential signal being equal to the time-variant amplitude subtracted by one-half of the time-variant amplitude.

20. The power management circuit of claim 19, wherein the signal demodulation circuit is further configured to:

regenerate the modulated phase correction voltage to equal one-half of a sum of the first differential signal and the second differential signal; and regenerate the modulated target voltage by subtracting the second differential signal from the first differential signal.

21. A wireless device comprising a power management circuit that comprises:

a power amplifier circuit configured to amplify an analog signal based on a modulated voltage; and an envelope tracking integrated circuit (ETIC) comprising:

a signal demodulation circuit configured to:

receive a modulated differential signal comprising a common signal modulated according to a first modulated signal and a differential signal modulated according to a second modulated signal; and demodulate the modulated differential signal to regenerate the first modulated signal and the second modulated signal;

a phase correction circuit configured to generate a modulated phase correction voltage based on the first modulated signal to thereby cause a phase change in the analog signal; and a voltage modulation circuit configured to generate the modulated voltage based on the second modulated signal.

* * * * *